(12) United States Patent
Hashido

(10) Patent No.: US 9,532,491 B2
(45) Date of Patent: Dec. 27, 2016

(54) ELECTRONIC EQUIPMENT AND FLEXIBLE PRINTED CIRCUIT

(71) Applicant: MITSUBISHI ELECTRIC CORPORATION, Tokyo (JP)

(72) Inventor: Ryuichi Hashido, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 281 days.

(21) Appl. No.: 14/102,228

(22) Filed: Dec. 10, 2013

(65) Prior Publication Data

US 2014/0176840 A1   Jun. 26, 2014

(30) Foreign Application Priority Data

Dec. 21, 2012  (JP) .................................. 2012-278876

(51) Int. Cl.
*H05K 9/00*     (2006.01)
*G02F 1/133*    (2006.01)
(Continued)

(52) U.S. Cl.
CPC ......... *H05K 9/0054* (2013.01); *G02F 1/13306* (2013.01); *G02F 1/13452* (2013.01);
(Continued)

(58) Field of Classification Search
CPC .... H05K 1/028; H05K 1/0224; H05K 1/0259; H05K 9/0054; H05K 3/361; H05K 2201/09681; H05K 2201/00715
(Continued)

(56) References Cited

U.S. PATENT DOCUMENTS 5,334,800 A * 8/1994 Kenney ................ H05K 1/0224
                                                    174/250
5,715,139 A   2/1998 Nakajima
(Continued)

FOREIGN PATENT DOCUMENTS

JP    07-154038 A   6/1995
JP    11-186686 A   7/1999
(Continued)

OTHER PUBLICATIONS

A Chinese Office Action issued by Chinese Patent Office on May 24, 2016, which corresponds to Chinese Patent Application No. 201310569305.X and is related to U.S. Appl. No. 14/102,228; with partial English language translation.
(Continued)

*Primary Examiner* — Courtney Smith
*Assistant Examiner* — Jessey R Ervin
(74) *Attorney, Agent, or Firm* — Studebaker & Brackett PC

(57) ABSTRACT

A shield layer is selectively formed on a front surface of a base film having an insulating property to form a wiring layer on a rear surface of the base film, and a connector connection terminal and a mounting terminal are selectively provided on the wiring layer. A liquid crystal display device is configured so as to be housed in a set housing, in a state that a TFT array substrate and a control board are connected to each other via an FPC having the structure as described above. In this case, the shield layer is provided in such a manner of opposing to an inner surface of the housing, the shield layer maintains an insulating relationship with the drive circuit, and is electrically connected to a portion of the housing via the first ground wiring portion.

9 Claims, 12 Drawing Sheets

(51) Int. Cl.
*H05K 1/02* (2006.01)
*G02F 1/1345* (2006.01)
*H05K 3/36* (2006.01)
*G02F 1/1333* (2006.01)

(52) U.S. Cl.
CPC ........... *H05K 1/028* (2013.01); *H05K 1/0259* (2013.01); *G02F 2001/133334* (2013.01); *H05K 1/0224* (2013.01); *H05K 3/361* (2013.01); *H05K 2201/0715* (2013.01); *H05K 2201/09681* (2013.01)

(58) Field of Classification Search
USPC .......... 361/748, 749, 784, 789; 174/254–258
See application file for complete search history.

(56) References Cited

U.S. PATENT DOCUMENTS

| | | | |
|---|---|---|---|
| 6,101,088 A | 8/2000 | Nakajima et al. | |
| 6,359,390 B1 * | 3/2002 | Nagai | G02F 1/133308 315/169.1 |
| 8,422,246 B2 * | 4/2013 | Nimura | H05K 9/0067 361/796 |
| 8,456,851 B2 | 6/2013 | Grunthaner | |
| 8,549,738 B2 | 10/2013 | Grunthaner | |
| 2009/0283300 A1 | 11/2009 | Grunthaner | |
| 2011/0094670 A1 | 4/2011 | Grunthaner | |

FOREIGN PATENT DOCUMENTS

| | | | |
|---|---|---|---|
| JP | 11186686 A | * | 7/1999 |
| JP | 2005-003766 A | | 1/2005 |
| JP | 2006-350243 A | | 12/2006 |
| JP | 2007-243091 A | | 9/2007 |
| JP | 2008-130584 A | | 6/2008 |
| JP | 2008-310088 A | | 12/2008 |
| JP | 2010-009594 A | | 1/2010 |
| JP | 2010-238755 A | | 10/2010 |
| JP | 2011-066065 A | | 3/2011 |
| JP | 2012-227211 A | | 11/2012 |

OTHER PUBLICATIONS

An Office Action; Notification of Reason(s) for Refusal, issued by the Japanese Patent Office on Oct. 25, 2016, which corresponds to Japanese Patent Application No. 2012-278876 and is related to U.S. Appl. No. 14/102,228; with English language translation.

* cited by examiner

F I G . 1
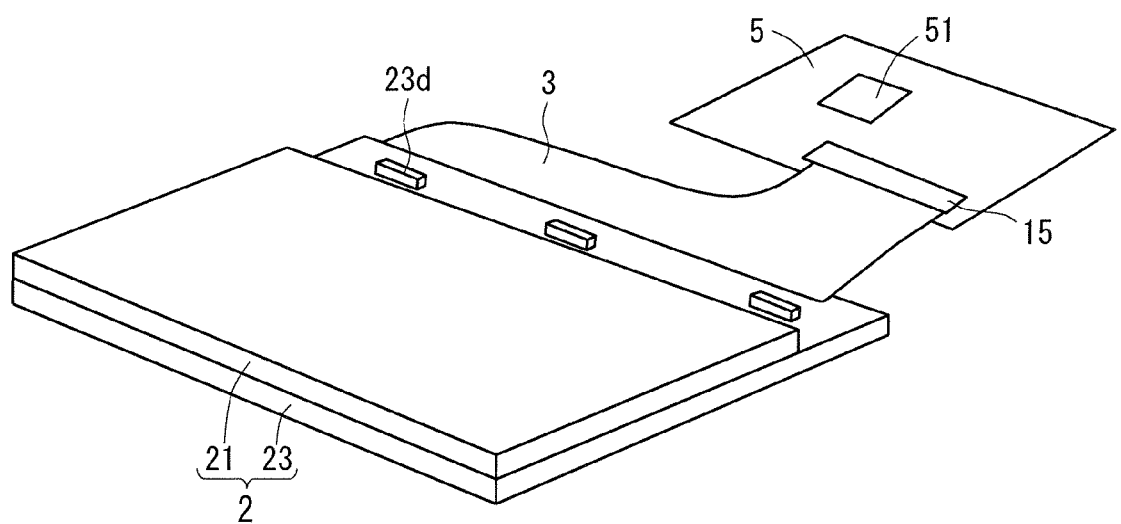

F I G . 2
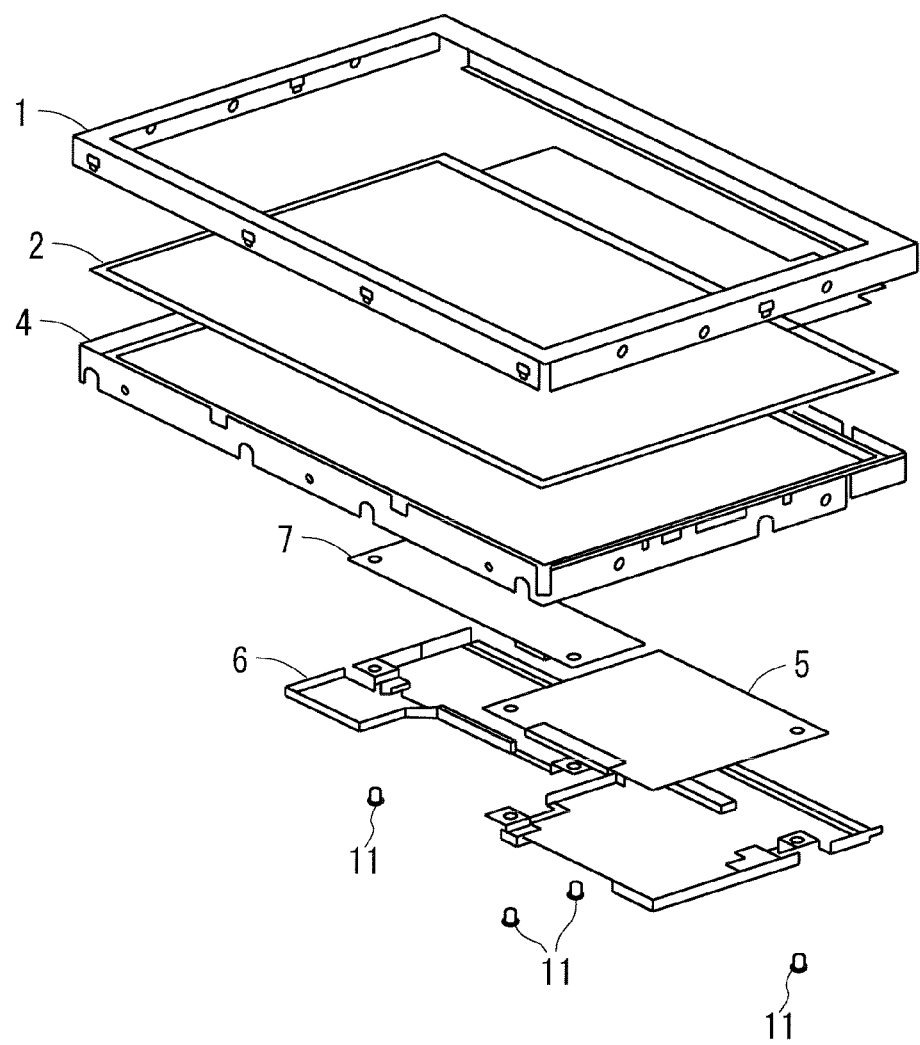

F I G . 1 6 A
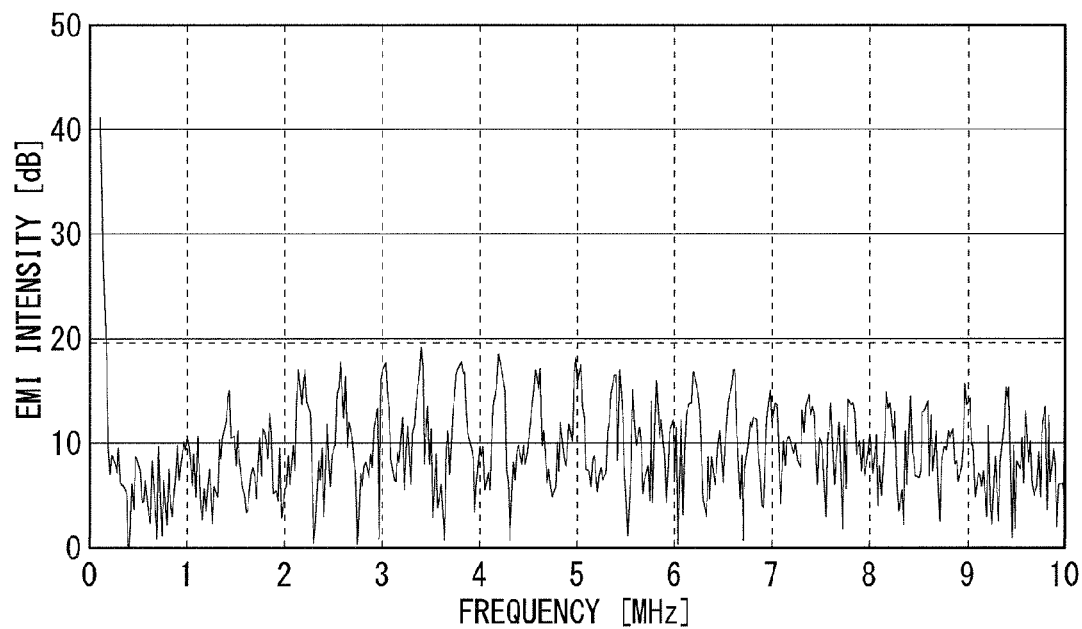
F I G . 1 6 B
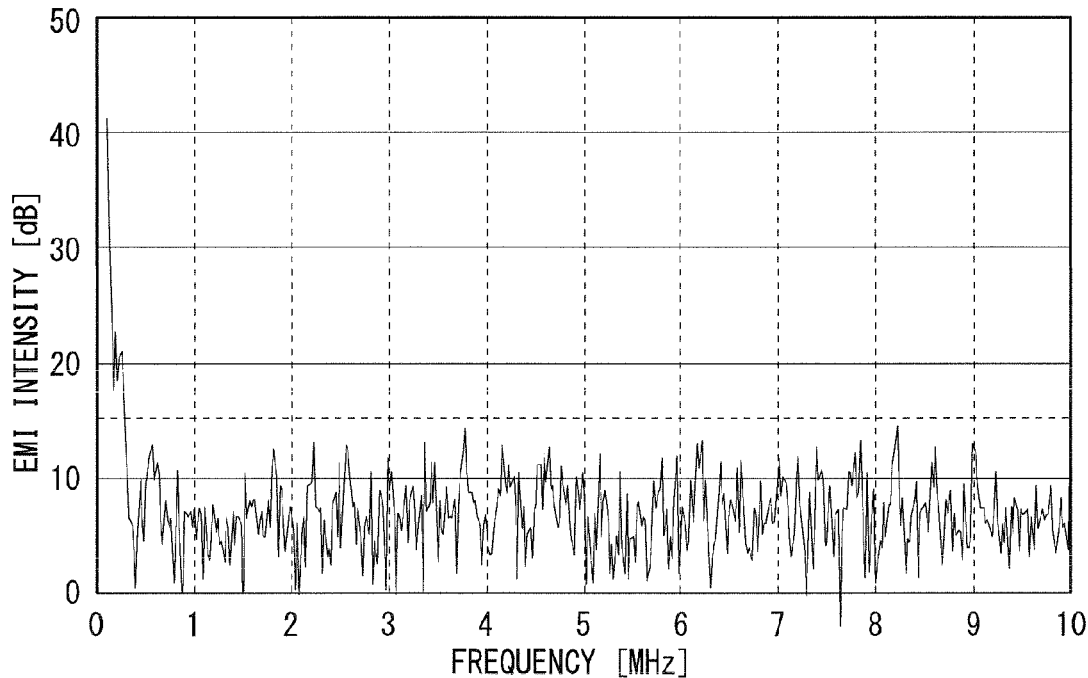

| APPLIED VOLTAGE [kV] | 8 | 10 | 15 | 20 |
|---|---|---|---|---|
| CONVENTIONAL CONFIGURATION | OK | OK | NG | NG |
| PREFERRED EMBODIMENT | OK | OK | OK | OK |

ELECTRONIC EQUIPMENT AND FLEXIBLE PRINTED CIRCUIT

BACKGROUND OF THE INVENTION

Field of the Invention

The present invention relates to electronic equipment, such as a liquid crystal display device and the like, configured by having a flexible printed circuit in a housing, and to the flexible printed circuit.

Description of the Background Art

There is a case in which electronic equipment, such as a liquid crystal display device, a notebook type portable computer, and the like, has flexible printed circuits (FPC; Flexible Printed Circuits) therein in order to become implementable to reduce in size. As this type of electronic equipment, for example, a disclosure is made of a base unit on which a keyboard of a portable computer in Japanese Patent Application Laid-Open No. H7-154038 (1995) is mounted.

The base unit has a box-like housing which houses a rigid circuit board on which various kinds of circuit components are mounted, and a plurality of functional components, such as a flexible disk drive and a hard disk drive, in an integrated manner. Moreover, the circuit board and the functional components are electrically connected to each other via the FPC.

In a configuration of electronic equipment such as the base unit described above, for example, in a case where a housing is formed of a nonconductive resin, an occurrence of ESD (Electro-Static Discharge) at an outside causes a charge induced in an inner wall of the housing to be charged up. The charge dielectrically breaks down a space between the charge and an FPC when exceeding a constant amount of charge, to flow into wiring and the like on the FPC as a current. At this state, there has been a case in which an abnormal voltage is applied to, or an abnormal current flows through a TFT panel and various sensors electrically connected to the FPC, or an IC and the like on a control board, causing a destruction thereof.

Further, there have been problems in which signal wiring on the FPC has an electromagnetic effect from an outside of the housing, and EMI (Electro-Magnetic Interference) emitted from wiring of the FPC is emitted to an outside world as it is to give an adverse effect to external equipment and the like.

SUMMARY OF THE INVENTION

An object of the present invention is to provide electronic equipment having flexible printed circuits and the flexible printed circuits, which can avoid an adverse effect occurring inside and outside an electric appliance with ESD or EMI.

The electronic equipment in accordance with the present invention includes a first and a second substrates, flexible printed circuits, and a substrate housing portion. A drive circuit driving a drive target is mounted on the first substrate, while a control circuit imparting a control signal for the drive circuit is mounted on the second substrate.

The flexible printed circuit board includes a first connecting portion connected to the first substrate, a second connecting portion connected to the second substrate, and internal wiring. The first and the second substrates are connected therebetween such that the drive circuit can be controlled by the control signal from the control circuit via the internal wiring. The housing portion houses the first and second substrates, and the flexible printed circuits therein.

The second substrate further includes a first ground wiring portion formed independently from the control circuit.

In the flexible printed circuits, a shield layer having conductivity is formed at a first main surface side, the conductivity being electrically independent from the internal wiring, a wiring layer in which the internal wiring is provided is formed at a second main surface side, and the shield layer is provided in such a manner of opposing to an inner surface of the housing portion. The shield layer maintains an insulating relationship with the drive circuit and is electrically connected to a portion of the housing portion via the first ground wiring portion.

According to the electronic equipment of the present invention, the housing portion is preliminarily adapted to be grounded. This arrangement can exert an electric discharge operation in which a charge induced by ESD in an inner surface of the housing portion can be reliably dissipated outside the housing portion via the shield layer and the first grounding wiring portion. Accordingly, an element and the like configuring the drive circuit of the first substrate or the control circuit of the second substrate can be reliably prevented from destruction by ESD.

In addition, the electric discharge operation can significantly reduce an electromagnetic effect affecting the flexible printed circuits from an outside of the housing portion, and an electromagnetic effect affecting the outside of the housing portion from the flexible printed circuits, thereby also preventing an adverse effect by EMI.

Further, the shield layer which maintains an insulating relationship with the drive circuit can suppress an adverse effect affecting the drive circuit of the first substrate at a time when the electric discharge operation is exerted.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an explanatory view showing a schematic structure of a general liquid crystal display device;

FIG. 2 is an explanatory view showing separated major components of the liquid crystal display device of FIG. 1;

FIGS. 16A and 16B are graphs each showing a reduction effect of an EMI intensity of the liquid crystal display device according to the preferred embodiments;

DESCRIPTION OF THE PREFERRED EMBODIMENTS

<The Principle of the Invention>

Figure 3:
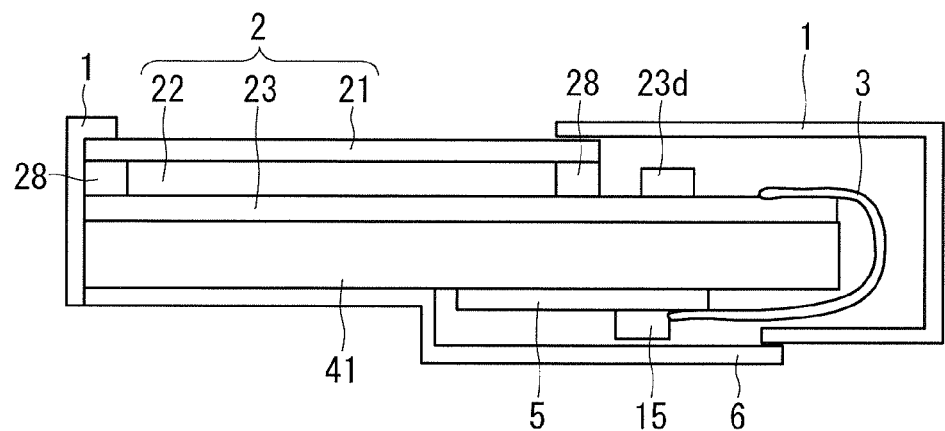
FIG. 3 is a cross-sectional view of the liquid crystal display device incorporated into a set housing.

FIG. 1 is an explanatory view showing a schematic configuration of a liquid crystal display device driving an LCD. As shown in the figure, the liquid crystal display device includes: a counter electrode substrate 21 having a CF (color filter) and a counter electrode; a TFT array substrate 23 (a first substrate) on which a drive circuit having a pixel portion for driving a liquid crystal is mounted, matrix-like wiring, and a driver IC23d in order to provide a signal to the pixel portion; and a TFT panel 2 configured to interpose a liquid crystal portion serving as a polarizer between the substrates 21 and 23.

Accordingly, the liquid crystal display device having the TFT panel 2 is configured to achieve a display operation in which a liquid crystal portion 22 (refer to FIGS. 3 and 4) serving as a drive target is driven by a liquid crystal drive circuit configured to include a counter electrode formed in the counter electrode substrate 21, a TFT array and the driver IC 23d formed in the TFT array substrate 23.

Further, the liquid crystal display device has an ASIC portion 51 for converting a control signal and an image signal to the driver IC 23d which drives the liquid crystal portion 22 serving as a drive target, and a control board 5 (a second substrate) on which a control circuit (various power supply circuits) including the ASIC portion 51 is mounted. Further, the liquid crystal display device is configured mainly with flexible printed circuits (FPC) 3 which physically connects the TFT array substrate 23 of the TFT panel 2 and the control board 5 therebetween to enable a transmission and a reception of a signal between the TFT array substrate 23 (the liquid crystal drive circuit thereof) and the control board 5 (the control circuit thereof).

FIG. 2 is an explanatory view showing separated major components of the liquid crystal display device. As shown in the figure, the TFT panel 2 and the control board 5 serving as a display system portion shown in FIG. 1, including an LED driver board 7, are incorporated into a set housing configured with a front frame 1 and a rear frame 6 to form a completed liquid crystal display device. Incidentally, the LED driver board 7 services as a substrate driving a backlight of a backlight module 4.

FIG. 3 is a cross-sectional view of the liquid crystal display device incorporated into the set housing configured with the front frame 1 and the rear frame 6. As shown in the figure, the TFT panel 2 is formed of a laminated structure of the TFT array substrate 23, the liquid crystal portion 22, and the counter electrode substrate 21. Incidentally, a sealing portion 28 functions as a spacer formed in an outer circumferential portion of the liquid crystal portion 22.

The TFT array substrate 23 of the TFT panel 2 is formed on a front surface (upper surface in FIG. 3) of a backlight portion 41 inside the backlight module 4, and a surface (a first main surface) of the TFT array substrate 23 is partially exposed to form the driver IC 23d on the exposed surface. On the other hand, the control board 5 which front surface (a first main surface) faces downward in the figure is formed on a rear surface of the backlight portion 41. Specifically, the liquid crystal display device is housed in the set housing in a positional relationship in which a rear surface (a second main surface) of the TFT array substrate 23 and a rear surface (a second main surface) of the control board 5 are opposed to each other.

Then, a first connecting portion out of two connecting portions (not shown) formed at both end portions of the FPC 3 respectively is electrically connected to the liquid crystal drive circuit, such as the driver IC 23d of the TFT array substrate 23 and the like, and a second connecting portion is connected to a connector 15 (electrical connection portion) formed on a front surface of the control board 5, so that the liquid crystal drive circuit (including the driver IC 23d) formed in the TFT array substrate 23 and the control circuit, such as the ASIC portion 51 and the like, formed in the control board 5 are electrically connected to each other. Therefore, the TFT array substrate 23 and the control board 5 are connected therebetween, such that the liquid crystal drive circuit is made controllable with the control signal imparted from the control circuit via internal wiring of the FPC 3.

Then, the TFT panel 2, the control board 5, and the FPC 3 described above are housed inside the set housing formed with the front frame 1 and the rear frame 6. In an example shown in FIG. 3, while the front frame 1 covers a part of an upper surface, a side surface portion, and a part of an under surface of the display system portion, the rear frame 6 covers a part of the under surface of the display system portion. On the other hand, a most part of the counter electrode substrates 21 is exposed.

As shown in FIG. 3, an inner surface (inner wall portion, inner surface of a side portion at the right side shown in FIG. 3) and a front surface of the FPC 3 (a first main surface, a surface at the right side shown in FIG. 3) are opposed to each other with a gap interposed therebetween. Conventionally, the front frame 1, the rear frame 6, and the like, used for a set housing have been mostly made of a metal, however, are recently made of a nonconductive resin, such as a plastic, and the like, in view of weight reduction and designability.

Figure 4:
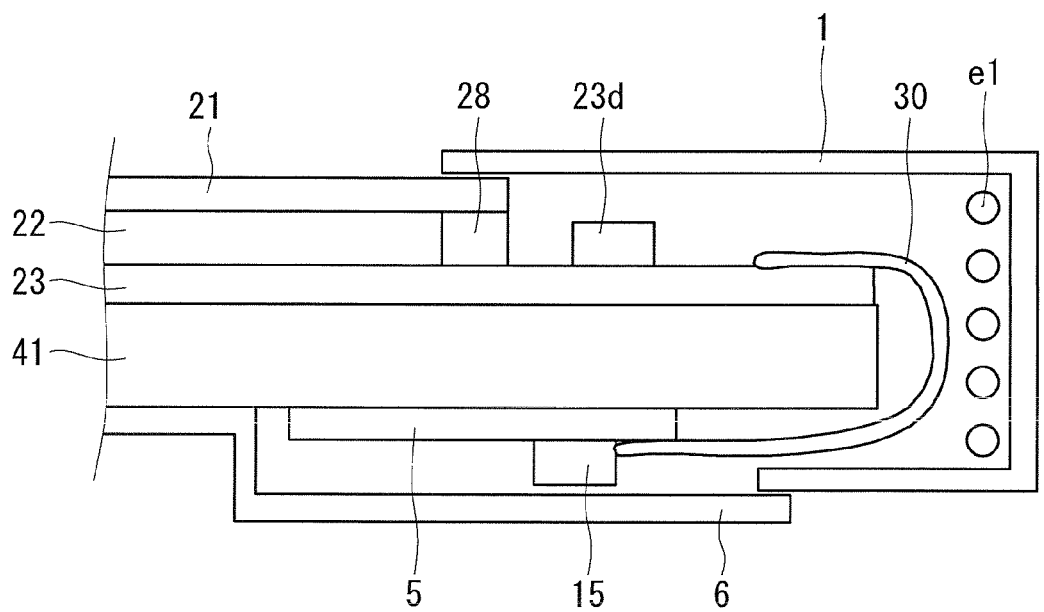
FIG. 4 is a cross-sectional view showing a problem in case of configuring a set housing using a nonconductive resin.
Figure 5:
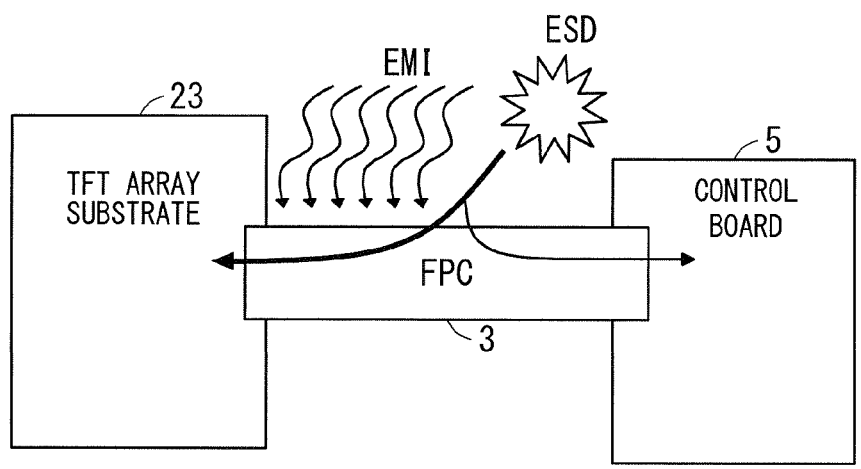
FIGS. 5 and 6 are explanatory views showing respective problems in case of configuring a set housing using a nonconductive resin.
Figure 6:
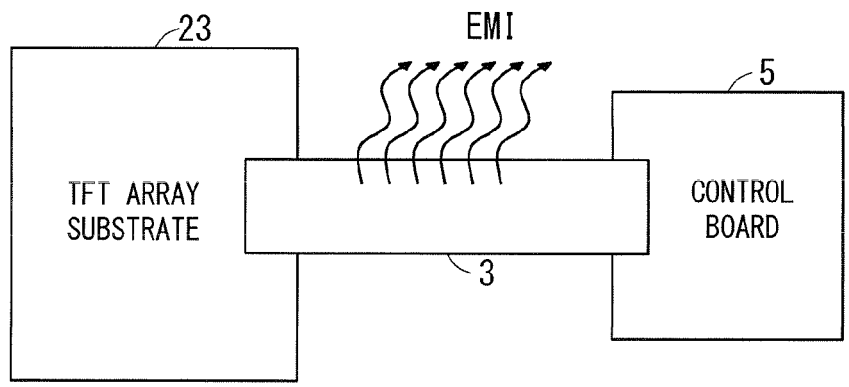

FIGS. 4 to 6 are explanatory views showing respective problems in case of configuring the set housing using a nonconductive resin.

A nonconductive resin has a nature in which a charge is charged up on a front surface (in an inner surface), therefore, as shown in FIG. 4, when a charged-up charge e1 exceeds a constant amount, there is a case in which a dielectric breakdown occurs to cause ESD in a metal portion and the like therearound. In addition, because of non-conductivity, the set housing has a problem in which with no shielding effect against electromagnetic wave, EMI is likely to occur (refer to FIG. 5). In the TFT array substrate 23 (liquid crystal drive circuit), ESD and EMI destroy an array portion, cause a display failure, or induce a malfunction, such as outputting a false signal, while inducing malfunctions, such as an IC breakdown, a freeze, a misdetection, and the like, in the control board 5 (control circuit).

Thus, in case of a nonconductive resin set housing, as shown in FIG. 4, for example, there is a problem in which a charged-up charge el induced by ESD from an outside enters through internal wiring of the FPC 3 inside the set housing to destroy the TFT panel 2 (TFT array substrate 23) or an IC and the like provided in the control board 5.

There is another problem in which an electromagnetic effect against the internal wiring of the FPC 3 from an outside, i.e., a noise, enters to cause a display disorder on the TFT panel 2, or in some instances, to induce malfunctions (immunity), such as a system freeze.

Further, there is another problem in which, as shown in FIG. 6, EMI emitted from wiring of the FPC 3 simply emits to an outside world to give an adverse effect to external equipment and the like, other than the liquid crystal display device.

Figure 7:
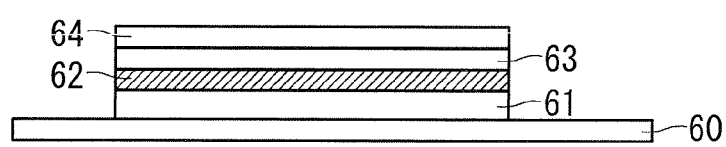
FIG. 7 is a cross-sectional view showing a first example of a conventional measure taken against EMI.

FIG. 7 is a cross-sectional view showing a first example of a conventional measure taken against EMI. As shown in the figure, a metal thin film 62 is adhesively formed on an FPC 60 (corresponding to the FPC 3 shown in FIGS. 1 and 3 to 6) with an adhesive layer 61 interposed therebetween, and then a base film 63 and a reinforcement film 64 are laminated on the metal thin film 62. The metal thin film 62 is possibly considered to be made of aluminum (Al) or the like, or otherwise an electromagnetic wave absorption material may be used.

Thus, the measure in the first example is taken against EMI by covering the FPC 60 with an electromagnetic wave absorption material or a conductive shield layer (tape) such as Al or the like. However, only an existence of the metal thin film 62 on the FPC 60 falls short of completely absorbing an eddy current guided by EMI, remaining a problem unsolved in which the eddy current partially passes through the metal thin film 62. Generally, this arrangement is not so effective in a low frequency region (e.g. several tens of MHz or less).

In addition, a shield by the metal thin film 62, shown in FIG. 7, is electrically isolated. When receiving ESD, energy thereof cannot be discharged to GND, an ESD absorption element on a circuit, and the like. The ESD, therefore, enters into a wiring layer in the FPC 60 positioned below the metal thin film 62. Accordingly, the ESD enters a circuit (liquid crystal drive circuit and control circuit) and the like formed in the TFT array substrate 23 or the control board 5 via the wiring layer of the FPC 60 to cause a misoperation, or to destroy various elements in the circuits, resulting in a fatal malfunction, in a worst case scenario. As described above, the first example of the conventional measure has various problems unsolved.

Figure 8:
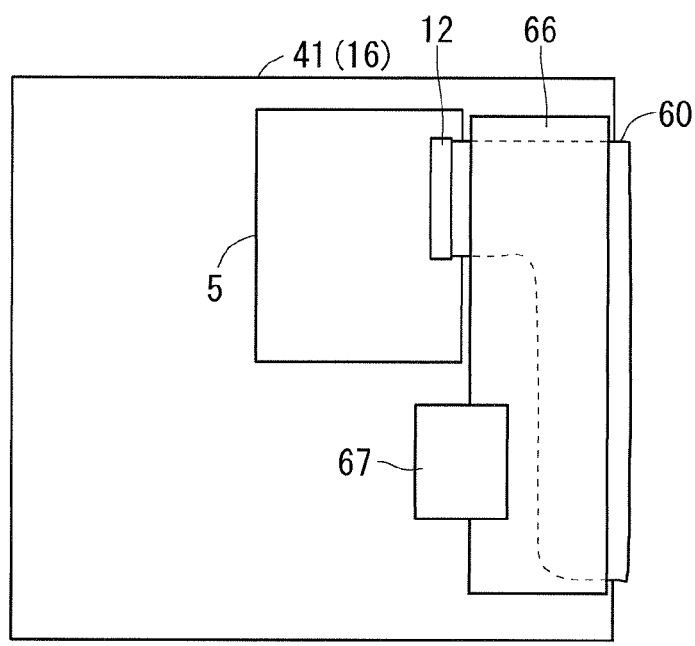
FIG. 8 is a plan view showing a second example of a conventional measure taken against EMI.

FIG. 8 is a plan view showing a second example of a conventional measure taken against EMI. FIG. 8 corresponds to a plan view in FIG. 3 viewed from a rear surface side of the TFT array substrate 23 (front surface side of the control board 5). However, an illustration of the rear frame 6 is omitted, for convenience of description, to show a transparent state of the rear frame 6.

As shown in the figure, a most part on the FPC 60 is covered to form a shield tape 66 that is affixed on a front surface of the backlight portion 41 by a conductive tape 67 made of Al or the like. Since the surface of the backlight portion 41 is generally formed of a metal frame, the backlight portion 41 becomes implementable to electrically connect to the rear frame 6 configuring a set housing 16 (housing portion) via the surface of the backlight portion 41.

Since the set housing 16 is generally connected to an outer ground (GND) for safety purpose, ESD falling to the shield tape 66 on the FPC 60 is discharged to the ground through the conductive tape 67, the backlight portion 41, and the rear frame 6 (set housing 16). Further, since the shield tape 66 serving as a shield conductive layer is connected to the ground with relatively-low impedance, a current and the like guided by a shield is dissipated to the ground to reduce an EMI emission to an outside.

While the conductive tape 67 made of Al or the like is bonded to an object with an adhesive made of a conductive resin and the like, the adhesive has difficulties to maintain conductivity with low resistance over a long period of time. Specifically, since the adhesive deteriorates with time to be peeled off after a lapse of a long period of time, with increasing conduction resistance, the shield tape 66 makes it impossible to connect an electric discharge path to the GND of the set housing 16 via the conductive tape 67 with low resistance. Further, there may be another problem of peeling off by a physical force, such as a vibration shock, and the like. Consequently, since this problem causes disconnecting to the GND via the shield tape 66 serving as a shield layer, there occur an increase of EMI and a destruction of an element by ESD, in a same manner as a case in which no measure is taken.

The shield tape 66 and the conductive tape 67 require materials cost thereof, and a step to be properly stuck to a corresponding portion. These requirements become a factor of cost increase to cause another problem.

Here, the present invention has been made to solve the problems described above, and hereinafter descriptions will be made for preferred embodiments in details.

<First Preferred Embodiment>

Figure 9:
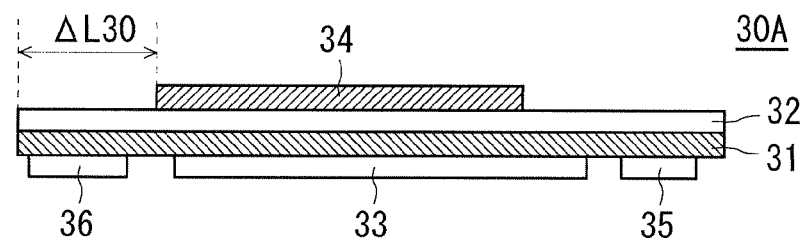
FIG. 9 is a cross-sectional view showing a structure of an FPC 30A used in a liquid crystal display device according to a first preferred embodiment of the present invention.

FIG. 9 is a cross-sectional view showing a structure of an FPC 30A used in a liquid crystal display device according to a first preferred embodiment of the present invention. As shown in the figure, a shield layer 34 is selectively formed on a front surface of a base film 32 having an insulating property to form a wiring layer 31 on a rear surface of the base film 32. Then, the wiring layer 31 is selectively provided with a connector connection terminal 35 (a second connecting portion) and a mounting terminal 36 (a first connecting portion) thereon, and is provided with a cover lay film 33 having an insulating property on a portion of the wiring layer 31 in which the terminals 35 and 36 are not formed. Nothing is formed on the shield layer 34, and thereby a front surface of the shield layer 34 is opened in an exposed state.

The FPC 30A having this type of structure is used such that the shield layer 34 formed at a front surface (a first major surface) side is brought into an outer side relative to a set housing 16, while the wiring layer 31 formed at a rear surface (a second major surface) side is brought into an inner side relative to the set housing 16. Specifically, in the structure of FIG. 3, when using the FPC 30A in place of the FPC 3, the shield layer 34 formed at the front surface side is arranged in such a manner of opposing to an inner surface of the set housing 16 to use the FPC 30A.

Then, as described above, the FPC 30A has an exposed structure in which no cover lay film is provided in a partial or an entire region directly above the shield layer 34. FIG. 9 shows a structure in which no cover lay film is provided in the entire region on the shield layer 34.

Figure 10:
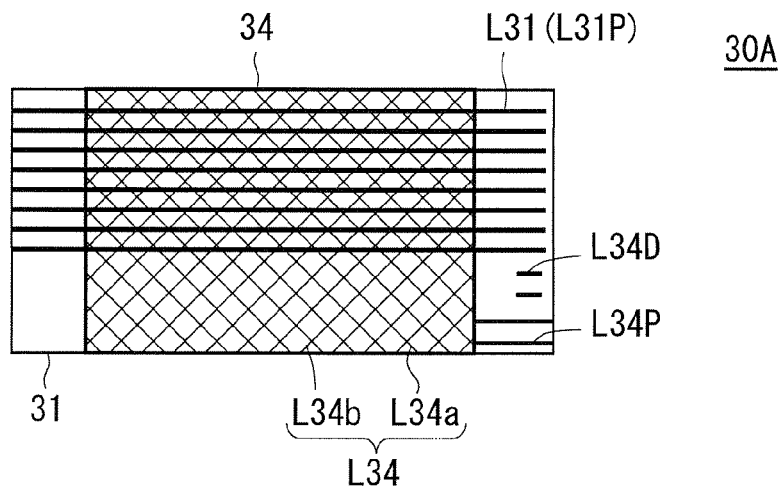
FIG. 10 is a plan view schematically showing a plane structure of the FPC used in the liquid crystal display device according to the first preferred embodiment.

FIG. 10 is a plan view schematically showing a plane structure of the FPC 30A. FIG. 10 illustrates a plan view in FIG. 9 viewed from a rear surface side (wiring layer 31 side), for convenience of description, illustrating a transparent state of the shield layer 34.

As shown in the figure, in the wiring layer 31, a plurality of wirings L31 (internal wiring) formed in straight lines along a longitudinal direction (horizontal direction in the figure) of the FPC 30A is provided to transmit signals transmitted and received between the TFT array substrate 23 and the control board 5 (the wiring L31 includes a power wiring).

On the other hand, a plurality of shield wirings L34a extending upward to the left and a plurality of shield wirings L34b extending upward to the right cross over each other to form a mesh-like wiring pattern on the shield layer 34 in the drawing.

In order to electrically connect to a side of the control board 5, a shielding PAD portion L34P, serving as a mounting portion which is electrically connected to the mesh-like wiring pattern of the shield layer 34, is guided via a through hole (TH) and the like to a rear surface (surface contacting the control board 5) side forming the wiring L31.

Specifically, as shown in FIG. 10, the wiring layer 31 is provided with the shielding PAD portion L34P electrically connected to the mesh-like wiring pattern of the shield layer 34 at an end portion of a side of the connector connection terminal 35, such that the shielding PAD portion L34P is spaced apart from the wiring L31 to maintain an insulating state therewith, and between the wiring L31 and the shielding PAD portion L34P, there is further formed a dummy PAD portion L34D which is electrically independent in a perfect manner.

A PAD portion L31P (corresponding to the connector connection terminal 35 in FIG. 9) as a tip portion of the wiring L31, the dummy PAD portion L34D, and the shielding PAD portion L34P are fitted into corresponding portions of a connector 15 to attach the FPC 30A to the connector 15. Then, the wiring L31 of the FPC 30A is electrically connected to a control circuit in the control board 5 via the connector 15.

In addition to the PAD portion L31P of the tip portion of the wiring L31, the dummy PAD portion L34D and the shielding PAD portion L34P are fitted into the corresponding portions of the connector 15. This arrangement allows a fitting force between the connector 15 and the FPC 30A to be increased. However, there is preferably provided a plurality of the dummy PAD portions L34D formed between the wiring L31 (L31P) and the shielding PAD portion L34P, in order to maintain a constant distance so as to prevent a creeping discharge therebetween to cause a dielectric breakdown. As a result, the constant distance as a sufficient space for forming the plurality of dummy PAD portions L34D can be maintained between the wiring L31 (L31P) and the shielding PAD portion L34P. In addition, these PAD portions preferably make as small as possible in space and shape, so as to make an insulation distance as large as possible.

In case that a mounting strength by the fitting force between the connector 15 and the FPC 30A is sufficient enough, and there is originally a creeping discharge distance which is sufficient with a targeted ESD susceptibility, it is, of course, not necessary to provide the dummy PAD portion L34D.

Figure 11:
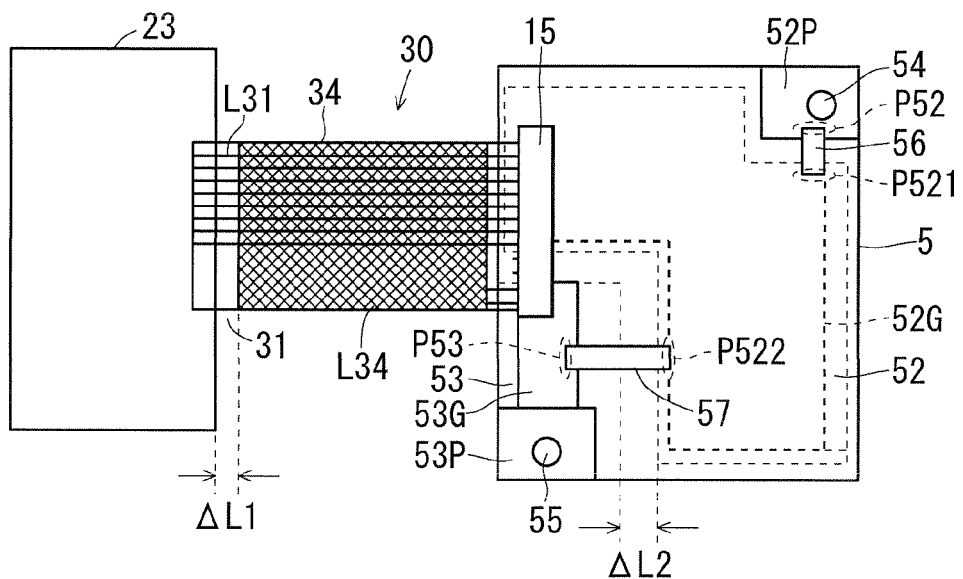
FIG. 11 is an explanatory view showing an example of an electrical connection between a TFT array substrate and a control board by the FPC shown in FIG. 10.

FIG. 11 is an explanatory view showing an example of an electrical connection between the TFT array substrate 23 and the control board 5 by the FPC 30A used in the first preferred embodiment of the present invention. The liquid crystal drive circuit of the TFT array substrate 23 is electrically connected to the wiring L31 via the mounting terminal 36 (refer to FIG. 9) of the FPC 30A, an illustration is omitted in FIG. 11 though.

As shown in the figure, it is essential that the shield layer 34 on the FPC 30A is not electrically connected to the TFT array substrate 23, and in addition, that ESD is prevented from falling at a side of the TFT array substrate 23.

Accordingly, an insulation distance $\Delta L1$ is provided between the shield layer 34 and the TFT array substrate 23 so as to avoid an occurrence of a creeping discharge between the TFT array substrate 23 and the FPC 30A with the targeted ESD susceptibility. Hereinafter, detailed descriptions will be made for this point.

In order to prevent a destruction of the TFT panel 2, the mesh-like wiring pattern of the shield layer 34 necessitates the insulation distance $\Delta L1$ from the mounting terminal 36 on which the FPC 30A to the TFT array substrate 23 is mounted. This arrangement causes ESD to be prevented from falling to the internal wiring of the TFT panel 2 (TFT array substrate 23) via the mounting terminal 36. Specifically, it is intended that the mesh-like wiring pattern of the shield layer 34 is not electrically connected to a side of the TFT panel 2 (TFT array substrate 23), and in order to prevent an electric discharge, there is preferably provided a distance $\Delta L30$ to a degree of the insulation distance $\Delta L1$, described above referring to FIG. 9, between an end portion of a side of the mounting terminal 36 of the wiring layer 31 and the shield layer 34.

In order to allocate a signal ground (Signal Gnd and SG) and a frame ground (Frame Gnd and FG) respectively and independently on the control board 5, a frame ground region 53 for an FG and a frame ground pattern portion 53P are formed independently from a signal ground region 52 for an SG and a signal ground pattern portion 52P, respectively.

The mesh-like wiring pattern formed with the shield layer 34 is required to be connected to a ground of an FG of the set housing instead of an SG for a measure against ESD.

The signal ground region 52 forming the control circuit can transmit and receive a signal obtained from the plurality of wirings L31 via the connector 15, and an SG ground real wiring region 52G (a second ground wiring portion) therein is electrically connected to the signal ground pattern portion 52P (a second ground fixing portion).

In this state, as shown in FIG. 11, there may be provided a pad portion P521 (a first pad portion) in the signal ground region 52, a pad portion P52 (a second pad portion) in the signal ground pattern portion 52P, and an element connectable region 56 into which an element, such as an ESD absorption element, or the like, can be inserted between the pad portions P52 and P521.

In this case, at least one of elements of the ESD absorption element, a resistor and a capacitor can be inserted between the pad portions P52 and P521, through the use of the element connectable region 56. Specifically, the ground real wiring region 52G of the signal ground region 52 and the signal ground pattern portion 52P can be electrically connected via the at least one of elements of the ESD absorption element, the resistor and the capacitor.

The signal ground pattern portion 52P is provided with a substrate fixed screw hole 54 into which a screw is fixed, so that the signal ground pattern portion 52P can be stably fixed in a corresponding portion of the set housing 16.

On the other hand, the shield layer 34 of the FPC 30A is electrically connected to the frame ground pattern portion 53P via the connector 15 by way of the ground real wiring region 53G (a first ground wiring portion) of the frame ground region 53. The frame ground pattern portion 53P is provided with a substrate fixed screw hole 55 into which a screw is fixed, so that the frame ground pattern portion 53P can be stably fixed to a corresponding portion of the set housing 16. As a result, an FG electric discharge path guided from the shield layer 34 to the set housing 16 is eventually formed as a measure against ESD.

It is essential that the ground real wiring region 53G and the frame ground pattern portion 53P are connected to the set housing 16 with as low impedance as possible for a measure against ESD. Therefore, as shown in FIG. 11, an FG PAD (shielding PAD portion L34P) of the connector 15, the ground real wiring region 53G in the frame ground region 53, and the frame ground pattern portion 53P are preferably provided on an identical flat surface of the control board 5.

Further, on the control board 5, it is necessary to separate the signal ground region 52 and the signal ground pattern portion 52P from the frame ground region 53 and the frame ground pattern portion 53P in every layer in a complete manner. As shown in FIG. 11, when these regions are formed on an identical layer (on a front surface of the control board 5), the signal ground region 52 and the frame ground region 53 are provided apart from each other with an insulation distance $\Delta L2$ so as to prevent an occurrence of a dielectric breakdown with the targeted ESD susceptibility.

Incidentally, there may be provided a pad portion P522 (a third pad portion) in the signal ground region 52, a pad portion P53 (a forth pad portion) in the ground real wiring region 53G of the frame ground region 53, and an element connectable region 57 into which an element, such as an ESD absorption element, or the like, can be inserted between the pad portions P522 and P53.

In this case, the at least one of elements of the ESD absorption element, the resistor, and the capacitor can be inserted between the pad portions P523 and P53 through the use of the element connectable region 57. Specifically, the ground real wiring region 53G of the frame ground region 53 and the ground real wiring region 52G of the signal ground region 52 can be electrically connected therebetween via the at least one of the ESD absorption element, the resistor, and the capacitor.

With this arrangement in which the element connectable region 57 insertable with the ESD absorption element, and the like, is provided between the pad portions P522 and P53, in addition to the FG electric discharge path described above, another electric discharge path guided to the frame ground pattern portion 53P via the ground real wiring region 53G, the ESD absorption element and the like, and the ground real wiring region 52G are usable for a measure against ESD, for example.

In addition, even in a case that the control board 5 has a multi-layer structure, a sudden strong current caused by ESD flows to the mesh-like wiring pattern of the shield layer 34, therefore, it is preferable not to provide a wiring in an overlap region in plan view.

Such an FPC 30A is arranged such that the shield layer 34 is opposed to an inner surface of the set housing 16, as described above, to configure the liquid crystal display device according to the first preferred embodiment.

In the liquid crystal display device according to the first preferred embodiment, the FPC 30A causes intentionally ESD to fall to the mesh-like wiring pattern of the shield layer 34 exposed (opened) onto the FPC 30A, keeping ESD from falling to the TFT array substrate 23 and the control board 5, and thereby, an FG electric discharge operation is carried out such that ESD is simply dissipated to the set housing 16 (connected to GND) via the connector 15, the ground real wiring region 53G and the frame ground pattern portion 53P of the frame ground region 53 of the control board 5.

Accordingly, this arrangement can reliably prevent ESD from destroying devices configuring the liquid crystal drive circuit of the TFT array substrate 23, ICs configuring the control circuit of the control board 5, and the like. In addition, the shield layer 34 having a reference potential shields an EMI emission from the wiring L31 serving as a signal wiring, and prevents a noise from an outside from being mixed in the wiring L31 serving as signal wiring.

On the other hand, in a liquid crystal display device, there may be a case in which the SG (GND for a signal) is provided therein, as described above, and generally a potential of the SG is made in common with that of the FG for preventing an electric shock. However, when there occurs any electric problem (including a current caused by ESD falling, as described above) on a housing at a time of simple connection with low impedance, a signal system is likely to have an adverse effect.

Then, as described above, it is preferable to insert the at least one element of the ESD absorption element, the resistor, and the capacitor into the element connectable region 56 between the pad portion P52 of the signal ground pattern portion 52P and the pad portion P521 of the signal ground region 52. With this arrangement, the adverse effect to the signal system can be reduced.

As described above, configuring a liquid crystal display device by using the FPC 30A according to the first preferred embodiment makes it possible to obtain cost-effectively the liquid crystal display device implementable to take measures against ESD and EMI, without using a special FPC or retrofitting a tape and the like.

<Application of a Double-Sided FPC>

While descriptions have been made for a one-sided FPC which is provided with the wiring layer 31 on one surface (rear surface) relative to the base film 32 in FIG. 9, an application is available in a double-sided FPC which is provided with a wiring layer on both surfaces.

As described above, ESD and EMI give effects on an area which, as shown in FIG. 4, is an inner surface portion, such as a closest side surface to the set housing (front frame 1 and the like) in the liquid crystal display device. On the other hand, the FPC 30A serving as one-sided FPC plays a role to wire connect a signal between the TFT array substrate 23 and the control board 5. While a one-sided FPC is used in a case where straight wiring on one-on-one basis is applicable, a double-sided FPC is used in a case where it is necessary to consider an interchange of wiring, contacts above and below of a connector, and the like.

Figure 12:
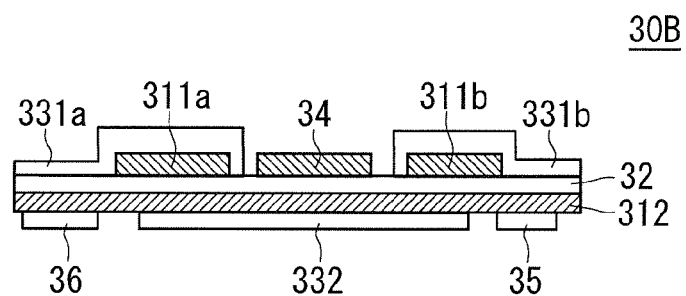
FIG. 12 is a cross-sectional view showing an example of a configuration of a double-sided FPC.

FIG. 12 is a cross-sectional view showing an example of a configuration of the double-sided FPC. As shown in the figure, in an FPC 30B, an upper layer wiring layer 311a, a shield layer 34, and an upper layer wiring layer 311b are selectively formed on a front surface of a base film 32. Upper layer cover lay films 331a and 331b are formed on the upper layer wiring layers 311a and 311b, respectively.

Then, a lower layer wiring layer 312 is formed on a rear surface of the base film 32. The lower layer wiring layer 312 is selectively provided with a connector connection terminal 35 and a mounting terminal 36 thereon, and is provided with a lower layer cover lay film 332 on a portion of the lower layer wiring layer 312 in which the terminals 35 and 36 are not formed.

Figure 13:
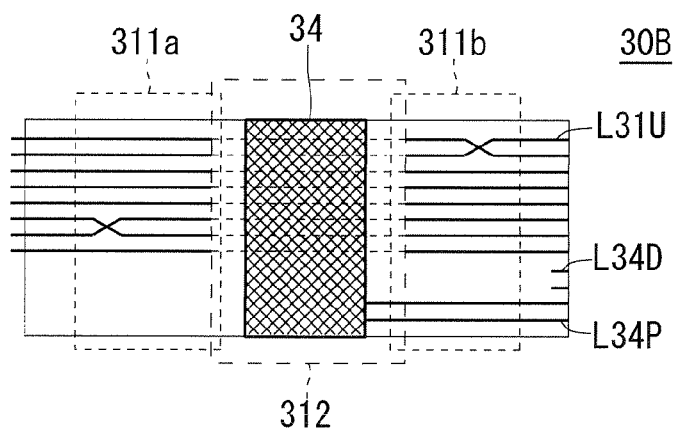
FIG. 13 is a plan view schematically showing a plane structure of the FPC shown in FIG. 12.

FIG. 13 is a plan view schematically showing a plane structure of the FPC 30B. FIG. 13 illustrates a plan view viewed from a front surface side (side of a formed surface of the shield layer 34) in FIG. 12. Since a wiring in the lower layer wiring layer 312 is substantially similar to the wiring L31 shown in FIG. 10, an illustration thereof is omitted.

As shown in the figure, in the upper layer wiring layers 311*a* and 311*b*, a plurality of upper layer wirings L31U is formed in straight lines along a longitudinal direction of the FPC 30B, and in a portion in which the shield layer 34 is formed, the plurality of upper layer wirings L31U are guided to a side of the lower layer wiring layer 312 (show in dashed lines) to wire in the lower layer wiring layer 312. Specifically, in the portion in which the shield layer 34 is formed, the upper layer wirings L31U is partially detoured to the lower layer wiring layer 312 to be wired. Since other configurations are similar to the configurations shown in FIG. 10, same reference symbols are used to omit descriptions thereof.

As described, the FPC 30B as a double-sided FPC is selectively provided with the shield layer 34 serving as a defined region for shielding on the base film 32, and when the upper layer wiring L31U passes through the shield layer 34 in plan view, the upper layer wiring L31U is wired on the lower layer wiring layer 312 of an opposite surface so as to once detour around.

Using the FPC 30B having this type of structure, with an attention focused on a region corresponding to a side surface which is most likely to induce ESD, the FPC 30B is arranged such that the shield layer 34 is opposed to an inner surface of the set housing. This arrangement can exert an effect in a same manner as that in the FPC 30A.

Since the shield layer 34 serving as a shielding region also serves as a measure against ESD, the shield layer 34 is arranged apart by a constant distance from the upper layer wirings L31U and the like formed on the same surface, so as to prevent an occurrence of discharge breakdown between neighbors. Since ESD necessitates to be intentionally guided to the shield layer 34 so as to be prevented from falling to the upper layer wiring L31U, a feature lies in that a metal portion of the shield layer 34 is exposed without being provided on the shield layer 34 with a cover lay which is generally provided for a purpose of insulation.

As described above, in a case of the FPC 30A as a one-sided FPC shown in FIGS. 9 and 10, there are simply formed the shield layer 34 at the front surface side and the wiring layer 31 at the rear surface side to realize the FPC 30A. Accordingly, unlike the FPC 30B which necessitates an interchange of wiring (upper layer wiring L31U) and the like, no requirement of defining a formed region of the shield layer 34 makes it possible to easily and effectively take measures. As described above, the same goes for not providing the cover lay on the shield layer 34.

Since a front surface of the shield layer 34 is uncovered in an exposed state, there causes a problem that rust serving as an insulator is formed thereon. Accordingly, from a viewpoint of long term rust prevention, it is preferable that a durable surface treatment is made, such as gold plating and the like, on the shield region formed with the shield layer 34. A gold plate treatment, particularly, is made for the mounting terminal 36 and the connector connection terminal 35 of the FPC, so that the treatment by the same process enables easy application and suppression of cost increase.

<Effects>

The FPC 30 (30A and 30B) in the liquid crystal display device according to the first preferred embodiment is provided in a state in which a surface (a first main surface) is opposed to an inner surface (inner wall) of the set housing 16, and there are formed at a front surface side, the shield layer 34 having conductivity and being electrically independent from the wiring L31 (L31U) serving as an internal wiring, and on a rear surface (a second main surface) side, the wiring layer 31 (312) provided with the wiring L31. The shield layer 34 of the FPC 30 maintains an insulating relationship with the liquid crystal drive circuit formed in the TFT array substrate 23, and is connected to a portion of the set housing 16 via the ground real wiring region 53G of the frame ground region 53, to be configured such that the FG electric discharge operation becomes implementable.

The liquid crystal display device according to the first preferred embodiment has the features described above, and thereby, a charge induced by ESD in an inner surface of the set housing 16 can be reliably dissipated outside the set housing 16 applied to be grounded via the shield layer 34, the ground real wiring region 53G and the frame ground pattern portion 53P. This arrangement can exert an electric discharge operation to reliably prevent ESD from destroying elements and the like configuring the liquid crystal drive circuit of the TFT array substrate 23, or the control circuit of the control board 5.

In addition, with the shield layer 34 being grounded at a constant standard potential, the electric discharge operation can significantly reduce an electromagnetic effect affecting the FPC 30 from an outside of the set housing 16, and an electromagnetic effect affecting an outside of the set housing 16 from the FPC 30, thereby also reliably preventing an adverse effect by EMI. In this way, the liquid crystal display device according to the first preferred embodiment becomes implementable to enhance durability.

Further, the shield layer 34 maintains an insulating relationship of the insulation distance ΔL1 with the liquid crystal drive circuit of a side of the TFT panel 2, so that an adverse effect to the liquid crystal drive circuit by a creeping discharge and the like can be avoided.

<Mesh-Like Wiring Pattern>

The shield layer 34 of the FPC 30 (30A and 30B) used in the liquid crystal display device according to the first preferred embodiment is configured with the mesh-like wiring pattern, as described above. By replacing the mesh-like wiring pattern, the entire region of the shield layer 34 may be configured with a ground plane as a conductive region. This arrangement can exert the effect described above.

However, a simple ground plane configuration generates a large parasitic capacitance between the shield layer 34 and the opposing wiring portion (wiring L31) with the base film 32 interposed therebetween, resulting in dulling a corresponding signal to decrease quality of the signal. In addition, the ground plane configuration has physical strength, which decreases flexibility in the shield layer 34, so that when being incorporated into a set, the shield layer 34 is less pliable, resulting in poor assemblability. Therefore, as described above, it is preferable to configure the shield layer 34 with the mesh-like wiring pattern, which can reduce a parasitic capacitance and improve pliability.

That is, the shield layer 34 of the FPC 30 in the liquid crystal display device according to the first preferred embodiment has the mesh-like wiring pattern in which a plurality of first shield wirings L34*a* and a plurality of second shield wirings L34*b* cross over each other, to become implementable to reduce a parasitic capacitance and to improve pliability.

<Second Preferred Embodiment>

The second preferred embodiment is for a liquid crystal display device using a refined FPC in which the mesh-like wiring pattern of the shield layer 34 of the FPC 30 (30A and 30B) becomes implementable to be refined.

The mesh-like wiring pattern is obtained simply by crossing over the first shield wiring L34a and the second shield wiring L34b each other, the first shield wiring L34a and the second shield wiring L34b being provided in opposite directions mutually with a 45-degree slant. However, there may cause following problems if simply obtaining the mesh-like wiring pattern as described above.

Figure 14A:
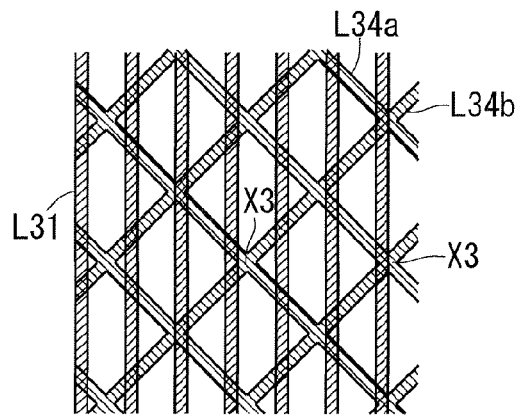
FIGS. 14A, 14B and 14C are plan views each schematically showing an overlapping relationship between a mesh-like wiring pattern formed in a shield layer and a plurality of pieces of wiring.
Figure 14B:
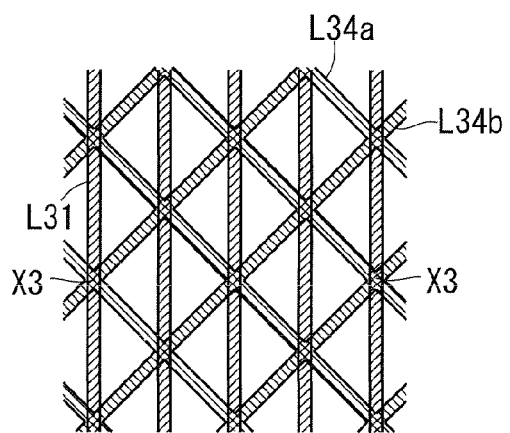
Figure 14C:
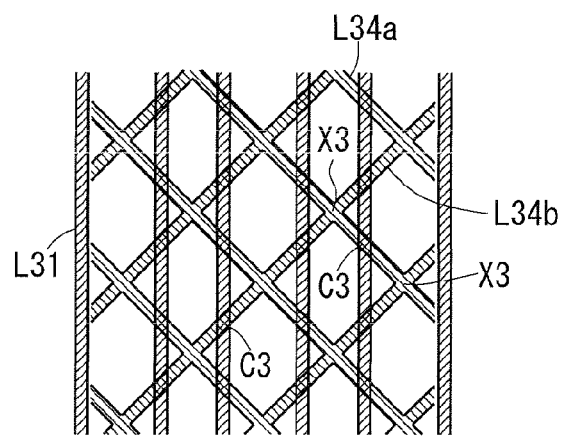

FIGS. 14A, 14B and 14C are plan views each schematically showing an overlapping relationship between the mesh-like wiring patterns and the plurality of wirings L31. As shown in FIG. 14A, when the mesh-like wiring pattern by the plurality of wirings L31, the first shield wiring L34a, and the second shield wiring L34b is viewed as transparent, there exist the wiring L31 crossing over in plan view an intersection point X3 forming a mesh, and the wiring L31 crossing over in plan view a portion between the intersection points of the shield wiring L34a (L34b), in a mixed state. Accordingly, due to variations of points where the wiring L31 crosses over in plan view the shield wiring L34, a parasitic capacitance (value) formed between the wiring L31 and the shield layer 34 varies. A large parasitic capacitance which simply dulls a waveform affects a drive capability of an ASIC portion 51, and the like, which configure the control circuit provided in the control board 5.

On the other hand, image signals and various control signals have limits on respective timings, and as the larger screen and the higher-speed responsiveness are required, the more precise timings are required. However, since the ASIC portion 51, and the like, outputting the image signals cannot adjust a timing individually, variations in impedance between pieces of wiring cause a problem on a capability of display limits.

As for EMI, a dull waveform, on the contrary, may be more preferable in some cases, therefore, the increase or decrease of the parasitic capacitance, to a certain extent, has not constituted any problem, while a timing adjustment, on the other hand, has become a large problem, so that it is essential to reduce variations of the parasitic capacitance.

Figure 15:
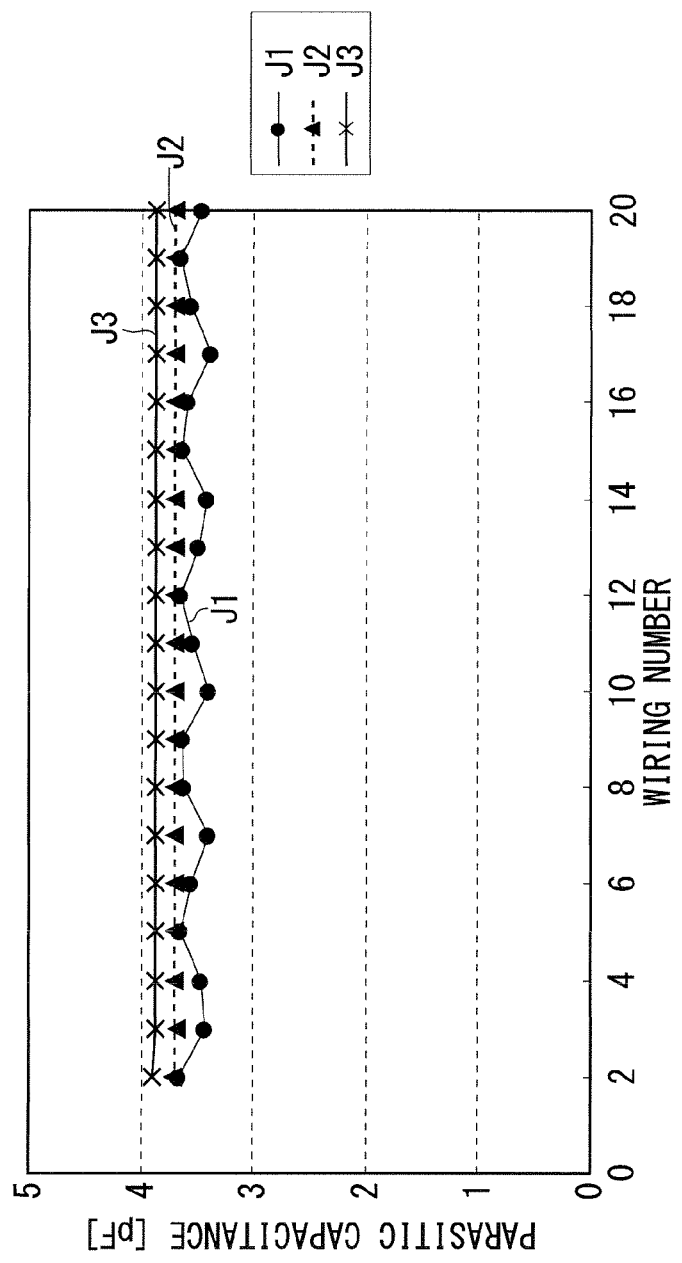
FIG. 15 is a graph showing respective parasitic capacitances according to mesh-like wiring patterns.

FIG. 15 is a graph showing parasitic capacitances according to mesh-like wiring patterns. Under a mesh condition J1, there occurs a relationship (wiring overlapping relationship) between the mesh-like wiring pattern and the wiring L31, shown in FIG. 14A, as described above. That is, the condition does not particularly consider the relationship between the mesh-like wiring pattern and the wiring L31.

Under a mesh condition J2, there occurs a wiring overlapping relationship in which the plurality of wirings L31 always crosses over in plan view the intersection points X3 of a mesh formed by the first shield wiring L34a and the second shield wiring L34b, as shown in FIG. 14B.

Under a mesh condition J3, there occurs a wiring overlapping relationship in which the plurality of wirings L31 always crosses over in plan view center points C3 which are between the two each of intersection points X3 of the mesh, and are on the first shield wiring L34a or the second shield wiring L34b, as shown in FIG. 14C.

Under the mesh condition J1 where the mesh is arranged without any consideration, as shown in FIG. 15, it is understood that the parasitic capacitance value of each wiring pattern relatively fluctuates in a periodic manner, because the mesh-like wiring portion and the straight wiring by the wiring L31 have different periodic patterns respectively.

On the other hand, under the mesh conditions J2 and J3, while absolute values of the parasitic capacitance slightly increase respectively, it is understood that variations of the capacitance decrease significantly, compared with a case when no adjustment is considered. That is, under the mesh conditions J2 and J3, variations of about 7.4 percent under the mesh condition J1 can be reduced to equal or less than about 0.7 percent.

While the mesh condition J2 is, basically, more preferable due to a smaller total capacitance value, either of the mesh condition J2 or J3 may be chosen depending on easiness in manufacturing of the FPC 30 (30A and 30B).

Thus, for the mesh-like wiring pattern of the FPC 30 in the liquid crystal display device according to the second preferred embodiment, satisfaction of the mesh condition J2 or the mesh condition J3 described above, can reduce variations in the parasitic capacitance which is generated between the mesh-like wiring pattern of the shield layer 34 and the wiring L31 formed in the wiring layer 31 via the base film 32 (base layer). This arrangement can minimize an effect on a timing of transmitting and receiving a signal between the liquid crystal drive circuit of the TFT array substrate 23 and the control circuit of the control board 5.

FIGS. 16A and 16B are graphs each showing a reduction effect of an EMI intensity by the liquid crystal display device according to the preferred embodiments (first and second preferred embodiments) described above. In FIG. 16A showing a conventional configuration in which a shield region is not particularly provided, it is understood that there periodically exist frequencies which generate peak noise. Although not shown in FIG. 16A, a similar result is found in such a low frequency region in a case where there is only a shield layer, as a conventional art, without connecting to an FG.

On the other hand, in a case when an FG is connected to the shield layer according to the preferred embodiment of the present invention, a result is likewise shown in FIG. 16B. It is understood that this arrangement generates no peak noise to significantly reduce the EMI intensity. Thus, the EMI intensity can be reduced to make a base noise fall below 15 dB. This means that an S/N can be obtained in all frequency bands to stabilize a signal waveform. Accordingly, this arrangement allows communication with no problem even dulling a signal waveform than before, thereby allowing further reduction of EMI and power consumption saving by lowering the drive capability.

While conventionally, the low frequency region has not, in particular, become a problem, there cause problems when using this type of devices under a specific environment, in which the low frequency region serves as a noise source to a sensor having a small signal for a medical treatment to degrade the S/N, or affects radio frequency bands of aircraft, accordingly, the present invention is particularly usable in these fields.

Figures 17, 18:
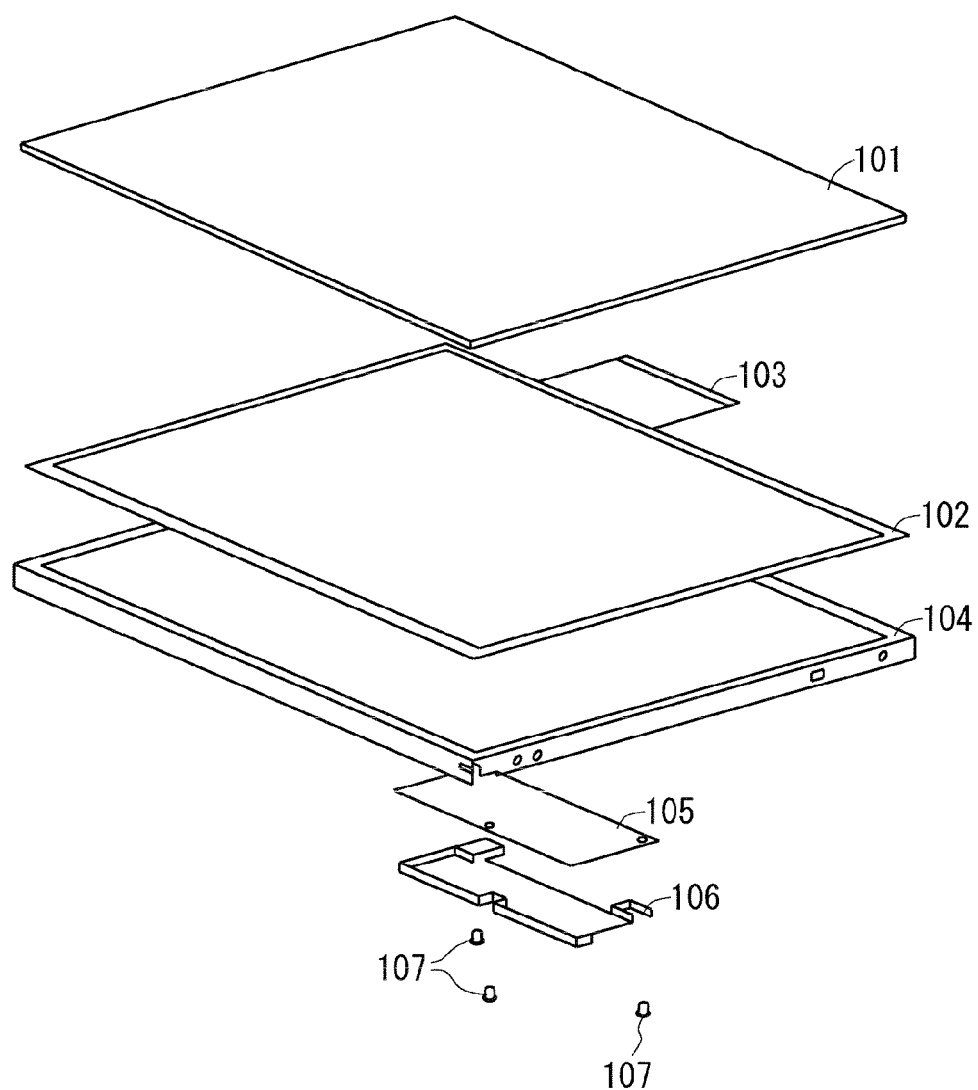
FIG. 17 is an explanatory view showing destruction results of respective elements in tabular form, when an electric discharge is directly applied thereto.
FIG. 18 is an explanatory view showing separated major components of a liquid crystal display device having a touch panel.

FIG. 17 is an explanatory view showing destruction results of respective elements in tabular form, when an electric discharge is directly applied to the set housing 16. As shown in the table, when ESD enters into the TFT panel 2 or the control board 5 and an applied voltage is equal to or more than 15 kV, the devices are destroyed (NG) and have no choice but being replaced in a maintenance work.

On the other hand, in the liquid crystal display device according to the preferred embodiments (first embodiment, second embodiment) of the present invention, a direct ESD current flows into an FG through the FPC 30, so that no element is destroyed. Therefore, even if a freeze occurs in a system of the liquid crystal display device, rebooting by powering off allows normal operation to be restarted and continued. This brings a significant advantage particularly when a liquid crystal display device is incorporated into a tight housing, or is used as a full-time operating liquid crystal display device, in which a maintenance work cannot be carried out.

<Others Features>

In the preferred embodiments, the above descriptions are given of examples of the liquid crystal display having the TFT panel 2. Specifically, the descriptions are made for the liquid crystal display device configured to be driven by the liquid crystal drive circuit including the counter electrode formed in the counter electrode substrate 21 relative to the liquid crystal portion 22 serving as a drive target, the TFT array and the driver IC 23*d* formed in the TFT array substrate 23, and the like.

The present invention is also applicable to a liquid crystal display device having a touch panel, in place of the TFT panel 2. In this case, there is provided the touch panel (sensor glass) formed of a glass substrate and the like including a sense drive circuit driving a sense function to detect a sensor portion for detecting an input position and a state of the sensor portion, at a position corresponding to the TFT panel 2, to electrically connect the sense drive circuit and the control circuit for the sense drive circuit formed in a substrate corresponding to the control board 5 to each other via an FPC.

Figure 19:
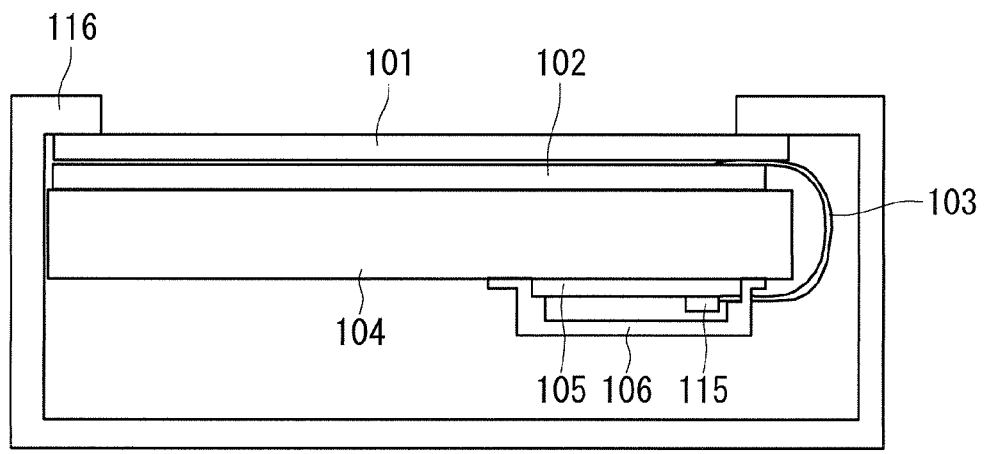
FIG. 19 is a cross-sectional view of the liquid crystal display device having the touch panel incorporated into a set housing.

FIG. 18 is an explanatory view showing separated major components of the liquid crystal display device having the touch panel. FIG. 19 is a cross-sectional view of the liquid crystal display device having the touch panel incorporated into a set housing.

As shown in these figures, the touch panel 102 serving as a sensor system portion, an LCD module 104 and a TP (touch panel) control board 105, including a front-surface protection film 101 and a shield metal 106, are incorporated into the set housing 116 formed with a front frame, a rear frame, and the like, to form a completed liquid crystal display device. Also in a liquid crystal display device of this kind having the touch panel 102, an FPC 103 is used for connecting the touch panel 102 and the TP control board 105 each other.

The touch panel 102 has an input-position detecting sensor portion (not shown) serving as a drive target, and a sense drive circuit (not shown) achieving a sense function to detect a state of the sensor portion. On the other hand, the TP control board 105 has a control circuit for the sense drive circuit (not shown).

As shown in FIG. 19, the touch panel 102 is provided on a front surface of the LCD module 104. A fixation of the touch panel 102 onto the LCD module 104 is carried out by means of, for example, sticking a double-sided adhesive tape on a peripheral frame portion of a front surface of the LCD module 104 to laminate to a corresponding peripheral portion of a rear surface of the touch panel 102, and the like. A liquid or solid sealing resin may be used to fix the touch panel 102 and the LCD module 104 each other.

Further, the TP control board 105 is provided on a rear surface of the LCD module 104, and a connector 115 electrically connected to the control circuit therein is selectively provided on a front surface (a first main surface) of the TP control board 105. Specifically, a rear surface (a second main surface) of the touch panel 102 and a rear face (a second main surface) of the TP control board 105 are housed in the set housing 116 in a positional relationship opposite to each other. Then, the shield metal 106 is fixed to the TP control board 105, covering over an upper part of the TP control board 105 including the connector 115. A fixing screw 107 is used to fix the shield metal 106 to the TP control board 105.

The front-surface protection film 101 is formed on a front surface (a first main surface) of the touch panel 102. An adhesive for sticking an overall surface is generally applied on a rear surface of the front-surface protection film 101, so that the rear surface of the front-surface protection film 101 can be stuck on the front surface of the touch panel 102. As the front-surface protection film 101, a functional film, such as a surface protective film, a scattering prevention film, an antifouling film, an optical polarizing film, and the like, is used according to an application. In addition, the functional film described above may be replaced by a cover glass or a cover resin to be used instead of the front-surface protection film 101. In a case of using a cover glass, the cover glass can be attached onto the touch panel 102 in a same manner as the fixation of the touch panel 102 onto the LCD module 104 by using a double-sided tape, or a liquid or a solid sealing resin which is stuck on a peripheral region of a front surface of the touch panel 102.

Then, there are provided a first and a second connecting portions (not shown) at both end portions of the FPC 103 respectively, and while the first connecting portion is electrically connected to the sense drive circuit of the touch panel 102, the second connecting portion is connected to the connector 115 (electrical connecting portion) formed on a front surface of the TP control board 105. With this arrangement, the sense drive circuit formed in the touch panel 102 and the control circuit formed in the TP control board 105 are electrically connected to each other. Therefore, the touch panel 102 and the TP control board 105 are connected therebetween such that the sense drive circuit is made controllable with a control signal imparted from the control circuit via internal wiring of the FPC 103.

Then, the touch panel 102, the TP control board 105, and the FPC 103, which are described above, are housed in an inside of the set housing 116. In an example shown in FIG. 19, the set housing 116 covers a part of an upper surface, side surface portions, and an under surface of the sensor system portion. On the other hand, a most part of the front-surface protection film 101 is exposed.

As shown in FIG. 19, an inner surface (inner wall portion, inner surface of a right-side side portion viewed in FIG. 19) of the set housing 116 and a front surface (a first main surface, right-side surface viewed in FIG. 19) of the FPC 103 are opposed to each other with a gap interposed therebetween.

Although there also exist other substrates and mechanisms in the set housing 116 besides the formed portions shown in FIG. 18, the illustration thereof is omitted, for convenience of description.

In the structure shown in FIG. 19, a left-side end portion of the LCD module 104 is brought into contact with an inside of a side surface of the set housing 116. Ideally, the set housing 116 is formed of metal, so that the contact described above can achieve a ground electrical connection between a ground portion of the set housing 116 and a frame ground formed in the LCD module 104. Of course, the ground electrical connection may be achieved by another fixing method.

On the other hand, in a case where the set housing 116 is formed of a nonconductive resin, the sensor system portion therein becomes in an electrically floating state from the set housing 116, and thereby, the liquid crystal display device having a touch panel becomes electronic equipment without taking measures against EMI and ESD, in a same manner as the conventional liquid crystal display device having the TFT panel 2 shown in FIGS. 1 to 8.

Therefore, also in the liquid crystal display device having a touch panel as shown in FIGS. 18 and 19, a similar effect can be exerted by using the FPC 30 (30A and 30B) described in the first and the second preferred embodiments.

That is, the FPC 30 denoted as FPC 103 in FIGS. 18 and 19 is provided, and is used, being arranged such that the shield layer 34 formed in a front surface side is opposed to an inner surface (side surface of an inside of the set housing 116 in FIG. 19) of the set housing 116. Then, the shield layer 34 of the FPC 30 maintains an insulating relationship with the sense drive circuit formed in the touch panel 102, and is connected to a portion of the set housing 116 via the ground real wiring region provided in the control circuit of the TP control board 105 to configure such that the FG electric discharge operation can be achieved. Also in the liquid crystal display having the touch panel 102, this arrangement thus can exert an effect in a same manner as that in the liquid crystal display device having the TFT panel 2.

In addition, the touch panel can be replaced by a scanner, an optical sensor, and like. Specifically, as far as a first substrate (corresponding to a touch panel or a glass substrate) having a drive circuit which is capable of detecting a state of a drive target of a sensor portion and the like, and a second substrate on which a control circuit which imparts a control signal for the drive circuit is mounted are connected to each other via the FPC 30 according to the preferred embodiment, and are housed in the set housing to be served as electronic equipment, the present invention can be applied to provide the similar effect.

While the invention has been shown and described in detail, the foregoing description is in all aspects illustrative and not restrictive. It is therefore understood that numerous modifications and variations can be devised without departing from the scope of the invention.

What is claimed is:

1. Electronic equipment comprising:
a first substrate on which a drive circuit driving a drive target is mounted;
a second substrate on which a control circuit imparting a control signal for said drive circuit is mounted;
a flexible printed circuit having a first connecting portion connected to said first substrate, a second connecting portion connected to said second substrate, and internal wiring, the flexible printed circuit connecting between said first and said second substrates such that said drive circuit can be controlled by said control signal from said control circuit via the internal wiring; and
a housing that houses said first and said second substrates, and said flexible printed circuit therein, wherein
said second substrate further has a first ground wiring portion formed independently from said control circuit,
said flexible printed circuit has a shield layer having conductivity and being electrically independent from said internal wiring at a first main surface side, and a wiring layer provided with said internal wiring at a second main surface side,
said shield layer is provided in such a manner of opposing to an inner surface of said housing, said shield layer maintains an insulating relationship with said drive circuit, and is electrically connected to a portion of said housing via said first ground wiring portion, and
said shield layer is separated from said first substrate by an insulation distance greater than 0 to thereby prevent any electrical connection between said shield layer and said first substrate.

2. The electronic equipment according to claim 1, wherein said flexible printed circuit includes:
a base layer having an insulating property;
said shield layer formed on a first main surface of said base layer; and
said wiring layer formed on a second main surface of said base layer, and
said shield layer has a mesh-like wiring pattern in which a plurality of pieces of first shield wiring and a plurality of pieces of second shield wiring cross over each other.

3. The electronic equipment according to claim 2, wherein said internal wiring has a plurality of wiring formed in straight lines along a wiring direction in an overlap region in plan view with said mesh-like circuit pattern, and,
said plurality of wiring is provided so as to cross over in plan view only intersection points of a mesh formed by said mesh-like wiring pattern in said shield layer, or so as to cross over in plan view only central points which are between adjacent intersection points of a mesh formed by said mesh-like wiring pattern, and are on said first shield wiring or on said second wiring.

4. The electronic equipment according to claim 1, wherein said control circuit has a second ground wiring portion for grounding,
said second substrate has a second ground fixing portion fixable to a portion of said housing, and
said second ground wiring portion has a first pad portion, and said second ground fixing portion has a second pad portion, so that at least one of elements of an ESD absorption element, a resistor, and a capacitor can be inserted between said first and said second pad portions.

5. The electronic equipment according to claim 4, wherein said first ground wiring portion has a third pad portion, and said second ground wiring portion has a fourth pad portion, so that the at least one of elements of the ESD absorption element, the resistor, and the capacitor can be inserted between said third and said fourth pad portions.

6. The electronic equipment according to claim 1, wherein said drive target serves as a liquid crystal portion, and
said drive circuit serves as a liquid crystal drive circuit driving said liquid crystal portion to execute a display operation.

7. The electronic equipment according to claim 1, wherein,
said drive target serves as a sensor portion, and
said drive circuit serves as a sense drive circuit achieving a sense function to detect a state of said sensor portion.

8. Flexible printed circuit comprising:
a base layer having insulating property;
a shield layer formed on a first main surface of said base layer; and
a wiring layer formed on a second main surface of said base layer and having internal wiring, wherein
said shield layer has a mesh-like wiring pattern in which a plurality of pieces of first shield wiring and a plurality of pieces of second shield wiring cross over each other, and
said shield layer is separated from an end portion of a side of a mounting terminal of said wiring layer by an insulation distance greater than 0 to thereby prevent any electrical connection between said shield layer and said mounting terminal.

9. The flexible printed circuit according to claim 8, wherein said internal wiring has a plurality of wiring formed in straight lines along a wiring direction in an overlap region in plan view with said mesh-like wiring pattern, said plurality of wiring is provided so as to cross over in plan view only the intersection points of the mesh formed by said mesh-like wiring pattern, or so as to cross over in plan view only the central points which are between the adjacent intersection points of the mesh formed by said mesh-like wiring pattern, and are on said first shield wiring or on said second shield wiring.

\* \* \* \* \*